United States Patent
Louis Joseph Dogue et al.

(10) Patent No.: US 6,541,182 B1
(45) Date of Patent: Apr. 1, 2003

(54) METHOD FOR FORMING FINE EXPOSURE PATTERNS USING DUAL EXPOSURE

(75) Inventors: Isabelle Louis Joseph Dogue, Seyssinet-Pariset (FR); Hitoshi Hatate, Saku (JP); Tsuneo Kagotani, Saku (JP); Tsutomu Aoyama, Saku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/690,824

(22) Filed: Oct. 18, 2000

Related U.S. Application Data
(60) Provisional application No. 60/210,455, filed on Jun. 9, 2000.

(51) Int. Cl.$^7$ .................................................. G03C 5/00
(52) U.S. Cl. ........................ 430/296; 430/312; 430/328; 430/942
(58) Field of Search ................................. 430/296, 312, 430/328, 942

(56) References Cited

U.S. PATENT DOCUMENTS

| | | | |
|---|---|---|---|
| 5,122,387 A | 6/1992 | Takenaka et al. | ............. 427/35 |
| 6,235,450 B1 * | 5/2001 | Nakasuji | ..................... 430/296 |

FOREIGN PATENT DOCUMENTS

JP      253808 1 B      9/1996

OTHER PUBLICATIONS

Bjorkholm et al., "EUV Lithography—The Successor to Optical Lithography?", Advanced Lithography Department; Technology Journal; 1998, pp.Q1–8 and Lithography pp. 8 and 9.

Krauss et al., "Nano–compact disk with 400 Gbit/in$^2$ storage density fabricated using nanoimprint lithography and read with proximal probe", Nov. 1997, Appl. Phys. Lett. vol. 71, pp. 3174–3176.

New et al., Submicron patterning of thin cobalt films for magnetic storage, J. Vac. Scl. Technol. B, vol. 12, No. 6, pp. 3196–3201 (Nov./Dec. 1994).

Nakatani et al., Ultramicro Fabrications on Fe–Ni Alloys Using Electron–Beam Writing and Reactive–Ion Etching, IEEE Transactions of Magnetics, vol. 32, No. 5, pp. 4448–4451 (Sep. 1996).

White et al., "Patterned Media: A Viable Route to 50 Gbit/in$^2$ and Up for Magnetic Recording", 6 pages, (Manuscript received Jun. 25, 1996).

"SCALPEL: A Projection Electron–Beam Approach to Sub –Optical Lithography", Technology Review of Lucent Tech. (Dec. 1999).

Chou et al., "Patterned Magnetic Nanostructures and Quantized Magnetic Disks", Proceedings of the IEEE, vol. 85, No. 4, pp. 652–671 (Apr. 1997).

Suzuki et al., "Research Report on the status of usage of data storage in the U.S.", Japan Record Media Industry Association, pp. 97–111 (Mar. 1999).

* cited by examiner

Primary Examiner—Christopher G. Young
(74) Attorney, Agent, or Firm—Morgan, Lewis & Bockius LLP

(57) ABSTRACT

A method for forming a pattern in a resist is provided. A resist is formed on a surface of a substrate. A first portion of the resist is exposed to a charged particle beam, such as an electron beam, to alter a first characteristic of the first portion of the resist. A second portion of the resist is exposed to electromagnetic radiation, such as UV light, to alter a second characteristic of the second portion of the resist. The second portion is larger than the first portion. At least part of the first portion is removed using the altered characteristics of the resist such that a remaining portion defines the pattern in the resist. Using this method, fine pattern resists having less than 100 nm resolution may be created at high throughput rates.

15 Claims, 12 Drawing Sheets

METHOD FOR FORMING FINE EXPOSURE PATTERNS USING DUAL EXPOSURE

The present application claims the benefit of U.S. Provisional Patent Application No. 60/210,455 filed Jun. 9, 2000, which is hereby incorporated by reference. The present application also hereby incorporates by reference U.S. Pat. No. 5,862,022 and U.S. patent application No. 09/500,544 filed Feb. 9, 2000.

BACKGROUND OF THE INVENTION

1. Field of the Invention

The present invention relates to the manufacturing of electronic components, and more particularly, to a method and apparatus for forming a finely-patterned resist layer on a substrate surface in the manufacturing of electronic components.

2. Description of the Related Art

In many technology areas, there has been a trend toward miniaturization. In the case of read/write equipment for magnetic storage media, recent technological evolution has increasingly caused a demand to reduce pattern size below 100 nm in order to achieve increased storage densities.

Conventional manufacturing of patterned devices involves patterning a resist layer formed on the surface of a substrate. Since the patterns of resist layers are increasingly required to be more fine than patterns achieved by existing ultraviolet light techniques, new technologies have recently appeared which use electron beams and X-rays. These technologies have shown great potential for forming pattern sizes as small as 100 nm.

However, in view of the continued technological evolution in the field of manufacturing electronic components such as magnetic storage components, it is desired to reduce pattern size drastically below 100 nm. Some new technologies for such nanofabrication, such as SCALPEL (SCattering with Angular Limitation Projection Electron-Beam) and EUV (Extreme Ultraviolet), are promising manufacturing processes within the next decade that achieve 70 nm patterns. See SCALPEL: A Projection Electron-Beam Approach to Sub-Optical Lithography, Technology Review of Lucent Tech. (December 1999).

However, generally, in the pursuit of sub 100 nm patterns, electron beam lithography presently remains one of the best techniques. Of the highest pattern resolutions reported to date, most were achieved using electron beam lithography. Its resolution is capable of defining patterns down to around 20 nm. Thus, e-beam lithography will remain as one of the major sub-100 nm pattern techniques, whether it is used for forming masks for X-ray or other lithography processes, or for direct writing onto resists.

One problem with electron beam lithography, however, is that it is currently impractical for device manufacturing because of long writing times. This issue becomes much more critical when a pattern size is below 30–40 nm because much higher electron beam doses are then needed.

U.S. Pat. No. 5,122,387 to Takenaka et al. describes a hybrid exposure method. In the method of Takenaka et al., an electron beam is used to expose fine pattern portions while UV irradiation is separately used to expose large pattern portions. Because two separate patterns are formed using two separate exposure systems, the fine pattern portions formed by the electron beam exposure still suffer from the above described drawbacks.

BRIEF SUMMARY OF THE INVENTION

Accordingly, the present invention is directed to a method and apparatus for forming fine exposure patterns that substantially obviates one or more of the problems due to limitations and disadvantages of the related art.

An object of the present invention is to provide a method and apparatus that efficiently forms exposure patterns having high resolution.

Another object of the present invention is to provide a method and apparatus for forming exposure patterns that reduce electron beam exposure time.

Another object of the present invention is to provide a method and apparatus for forming resist exposure patterns having high throughput.

Additional features and advantages of the invention will be set forth in the description which follows, and in part will be apparent from the description, or may be learned by practice of the invention. The objectives and other advantages of the invention will be realized and attained by the structure and methods particularly pointed out in the written description and claims hereof as well as the appended drawings.

To achieve these and other advantages and in accordance with the purpose of the present invention, as embodied and broadly described, a method for forming a pattern in a resist is provided. A resist is formed on a surface of a substrate. A first portion of the resist is exposed to a charged particle beam to alter a first characteristic of the first portion of the resist. A second portion of the resist is exposed to electromagnetic radiation to alter a second characteristic of the second portion of the resist. The second portion is larger than the first portion. At least part of the first portion is removed using the altered characteristics of the resist such that a remaining portion defines the pattern in the resist.

In accordance with a more limited aspect of the invention, the first portion of the resist is exposed to an electron beam.

In accordance with a still more limited aspect of the invention, the second portion of the resist is exposed to ultraviolet light.

In accordance with another aspect of the invention, an apparatus for forming a pattern in a resist on a substrate is provided. An electron-beam unit exposes to an electron beam a representation of a pattern on a first portion of a resist on a substrate. An electromagnetic radiation exposure system exposes a second portion of the resist to electromagnetic radiation. A surface area of the second portion is greater than a surface area of the first portion. A developing unit removes at least part of the first portion of the resist thereby leaving the pattern in the resist.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention. Together with the description, the drawings serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

The present invention uses electron beam (e-beam) exposure to create a fine pattern mask and ultraviolet (UV) light to additionally treat the resist in order to provide improved mask resolution and higher manufacturing throughput. This dual exposure achieves increased resist sensitivity, and reduced exposure and developing time for preparing nanometer scale patterns. In this manner, e-beam exposure is advantageously coupled with UV exposure to substantially increase resist sensitivity without substantially degrading the resolution when using a high resolution developer. The present invention may be applied to achieve direct writing of nanometer patterns using electron beam lithography with deep-UV lithography.

Figure 1:
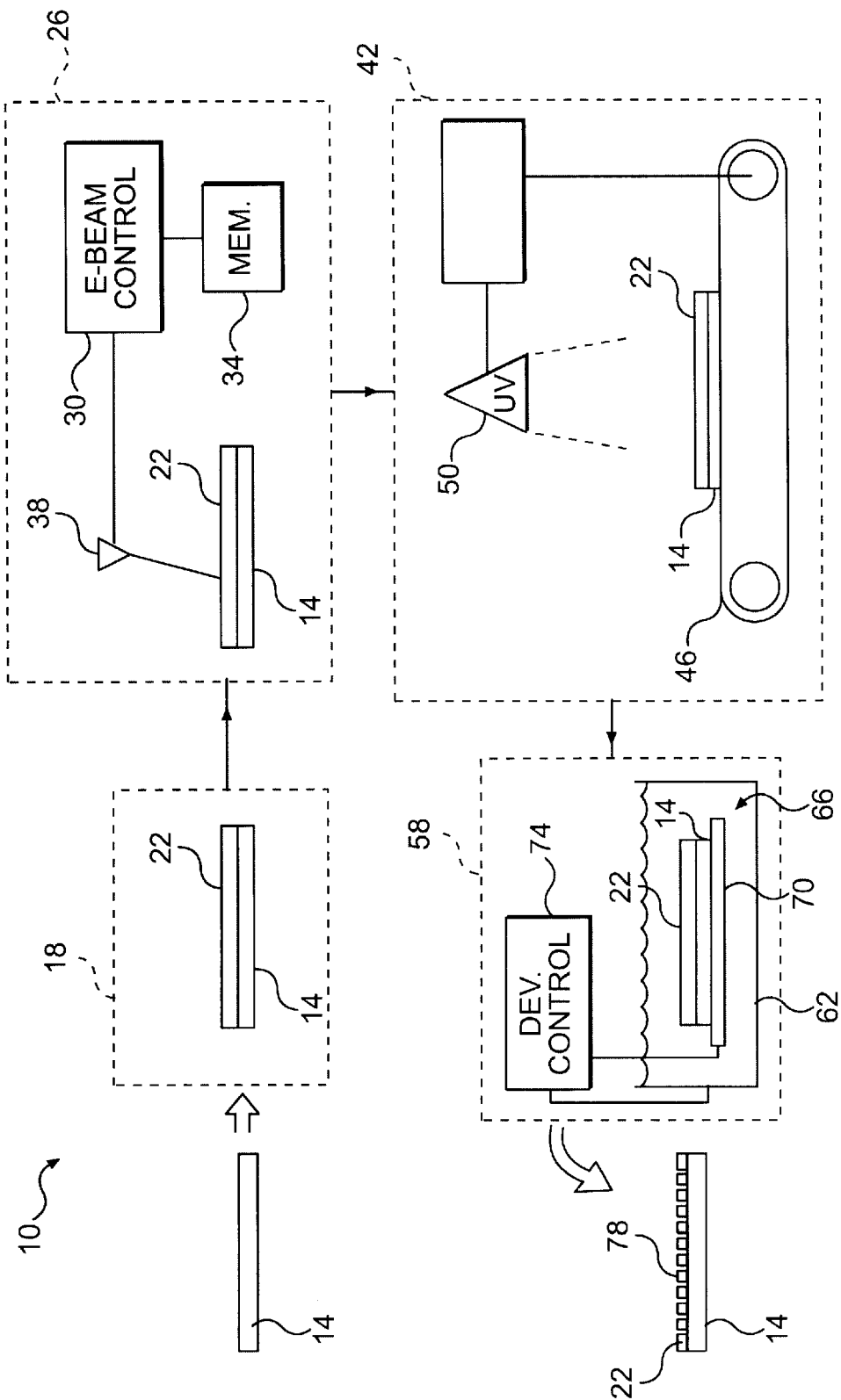
FIG. 1 is a block diagram showing an apparatus for producing fine pattern resin masks in accordance with the present invention.

With reference to FIG. 1, an apparatus 10 for creating and developing fine pattern resists or masks receives a substrate 14 such as a silicon wafer. Preferably, the fine pattern mask will have a resolution or line and space (L&S) width of less than 100 nm. More preferably, the fine pattern mask will have a resolution of less than or equal to 40 nm. A coating unit 18 applies a positive tone scission-type resist 22 onto the substrate. Typically, resists start as polymers dissolved in a liquid solvent. In the coating unit, the liquid resist is dropped onto the substrate, which is then spun at 1000 to 6000 rpm to form a film between 0.05 to 0.3 $\mu$m. An exemplary resist is ZEP 520 from Nippon Zeon, which is a positive-tone and solvent-developable e-beam resist suited for the creation of masks as well as ultra-fine processing. This resist has high sensitivity, namely 55 or 30 $\mu C/cm^2$, with N-amyl acetate or butyl acetate developers, respectively. Then, the resist film is baked using, for example, a hot plate (not shown) at 180° C. for 5 minutes.

The coated substrate is then transferred to an e-beam pattern-forming unit 26. An e-beam controller 30 accesses a pattern memory 34 to select data for a desired fine pattern. Based on the fine pattern data, the controller controls a directionally-controllable e-beam tool 38 to rapidly scan or expose the fine pattern onto the resist. While other components can be utilized, an exemplary e-beam source includes a 5 kV JEOL 6000FS e-beam tool operated with a current of 100 pA. Those regions of the ZEP resist that are exposed to the e-beam undergo chain scission. Of course, other types of resists might instead undergo cross-linking. A preferred e-beam exposure dose is 30 to 120 $\mu C/cm^2$.

The coated substrate is then transferred to a UV drier or UV exposure system 42. The drier includes a conveyor 46 to support and move the substrate under a UV lamp 50. A UV drier control 54 controls the intensity and/or on-off state of the UV lamp and the speed v of the conveyor in order to expose the resist to a precise dose of UV light. In a preferred embodiment, an 80 W mercury lamp is used. Low energy UV radiation is preferred to avoid damage to the resists due to their sensitivity to UV radiation. A preferred UV intensity is less than 100 mJ/cm$^2$. In an alternative embodiment, the UV drier may include a stationary stage for fixing the substrate and exposing the resist to UV irradiation for a predetermined amount of time at a predetermined intensity.

The UV dose is applied generally over the entire resist surface, thus exposing regions that were previously both exposed and not exposed to the electron beam. The UV light causes some chain scission in the previously unexposed regions and additional chain scission in the previously exposed regions. Of course, with other types of resists, cross-linking instead of chain scission might occur. In an alternative embodiment, the positions of the UV drier and electron beam unit are switched so that UV exposure occurs before fine-pattern electron beam exposure. In another alternative embodiment, the UV drier and e-beam unit may be combined such that simultaneous exposure occurs. It is to be appreciate by one skilled in the art that, instead of UV light, other forms of electromagnetic radiation may be used provided the radiation causes desired chain scission or cross-linking in a selected resist.

The twice-exposed coated substrate is then transferred to a developing unit 58. The developing unit includes a bath 62 of a developer 66. The substrate is placed on a support 70 and immersed in the developer for a certain time. The developer dissolves the resist at rates dependent on the amount of chain scission in the resist and the solubility rate of the resist for the particular developer. A developer controller 74 controls various aspects of the developing system, such as immersion time, to appropriately develop the fine-pattern mask. Exemplary developers include N-amyl acetate (ZED-N50) and butyl acetate (ZR-100), which are both manufactured by Nippon Zeon, or diethyl ketone manufactured by Kanto Chemical. The developer removes substantially all of the resist that was exposed to the e-beam and only a negligible, superficial amount of the resist that was only exposed to the UV light. Once developing is complete, the substrate is output with a fine-pattern mask 78. The substrate may now undergo further processing to become an electrical component.

One area of use for the fine-pattern mask of the present invention is in the fabrication of magnetic structures using lithography. In a first step, a resist mask is formed on a substrate using any of the above described methods or modifications thereof. The resist mask can be used to pattern structures using a number of conventional techniques, such as a lift-off process, electroplating, or etching. In a lift-off process, after a ferromagnetic metal film is deposited onto the sample, the sample is immersed in a solvent which dissolves the mask and lifts off only the metal on the resist surface, but not the metal on the substrate. In an electroplating process, a thin metal plating base is placed between the resist and the substrate, and the resists is removed after plating. In an etching process, exposed areas of the substrate are etched while areas covered by the mask are not.

Subsequently, the etched substrate is used to create magnetic structures using conventional methods.

Another area of use for the fine-pattern mask of the present invention is in the fabrication of chips or integrated circuits. For example, the fine pattern mask may be formed on a Silicon substrate using any of the techniques described above or modifications thereof. The mask then protects regions of the substrate during subsequent doping by ion beam implantation or diffusion to create transistors in the substrate.

Still another application for the fine-pattern mask of the present invention is in the manufacturing of read/write heads for use with magnetic storage media. Such heads require fine structures to achieve high recording densities. The fine-pattern mask may be used to create the fine structures of the head using conventional fabrication techniques.

In developing and evaluating the invention, various tests were performed which will now be described. Thickness measurements of the resist were performed using a P-10 Profiler from Tencor Instruments. Further, the resist structures were observed by scanning electron microscopy using a JEOL 6340F system.

First, the effects of UV exposure on overall thickness reduction during developing was investigated. An electron beam scission type resist, such as ZEP series from Nippon Zeon, was selected because such resists are also sensitive to UV radiation. UV (mercury) lamps emit at wavelength higher than 200 nm and generate ozone when operated at wavelengths between 200–230 nm. Both UV light and ozone usually induce severe chemical modifications of polymers, namely cross-linking and/or degradation together with oxidation, which the present invention utilizes to enhance the resist performance. Specifically, because ZEP resists are linear copolymers of α-methyl styrene (70 wt %) and α-cloromethacrylate (30 wt %), one can hence expect severe degradation under UV light.

However, the present invention seeks to use the UV light in a manner to avoid UV ozone ashing. That is, UV ozone ashing may result in ZEP stripping as is utilized in microelectronic processes. Instead, the present invention has found that the level of degradation depends on the UV irradiation conditions.

Figure 2:
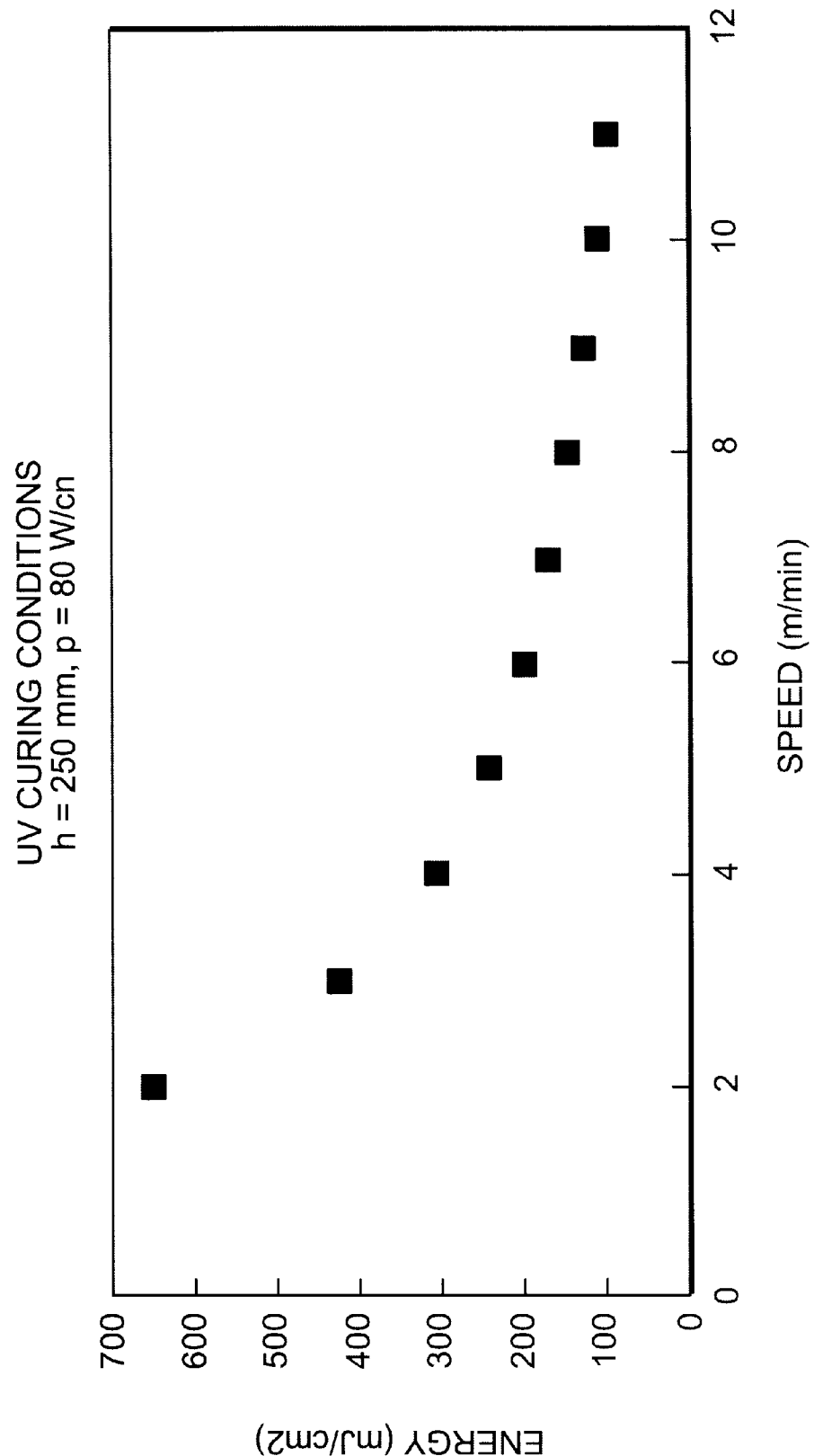
FIG. 2 is a graph showing the relation between UV dose and conveyor speed in a UV exposure system.

UV exposures from 80 to 1500 mJ/cm$^2$ were tested by varying the distance between the sample and the UV lamp, and the conveyor speed as exemplified in the apparatus of FIG. 1. The calibration curve of FIG. 2 shows the relation between the UV dose and conveyor speed for a particular height. After irradiation under UV light, the resist was dipped at room temperature in N-amyl acetate for 5 minutes. N-amyl acetate is a preferred developer for ZEP 520 when high resolution is desired. Table 1 summarizes the thickness reduction measured after development with N-amyl acetate for 5 minutes with varied UV radiation dosage.

TABLE 1

Resist Thickness Reduction v. UV Exposure

| UV Dose | Initial Resist Thickness | Final Resist Thickness |
|---|---|---|
| 0 mJ/cm$^2$ | 113.5 nm | 111 nm |
| 90 mJ/cm$^2$ | 239 nm | 235 nm |
| 1077 mJ/cm$^2$ | 136 nm | <10 nm |

From Table 1, it can be recognized that soft conditions of UV exposure (<100 mJ/cm$^2$) did not induce severe degradation of the resist. Only a slight thickness reduction could be measured, such as, thickness reduction within the range of 1–2%. Under stronger UV exposure, because of degradation, the resist was completely dissolved in the N-amyl acetate developer or at least partly removed. Thus, soft conditions of UV exposure are most desirable because it will allow areas of the resist not previously exposed or not subjected to subsequent exposure to remain thick after developing. Accordingly, for further tests, the UV dose was fixed to 85–90 mJ/cm$^2$.

Figure 3:
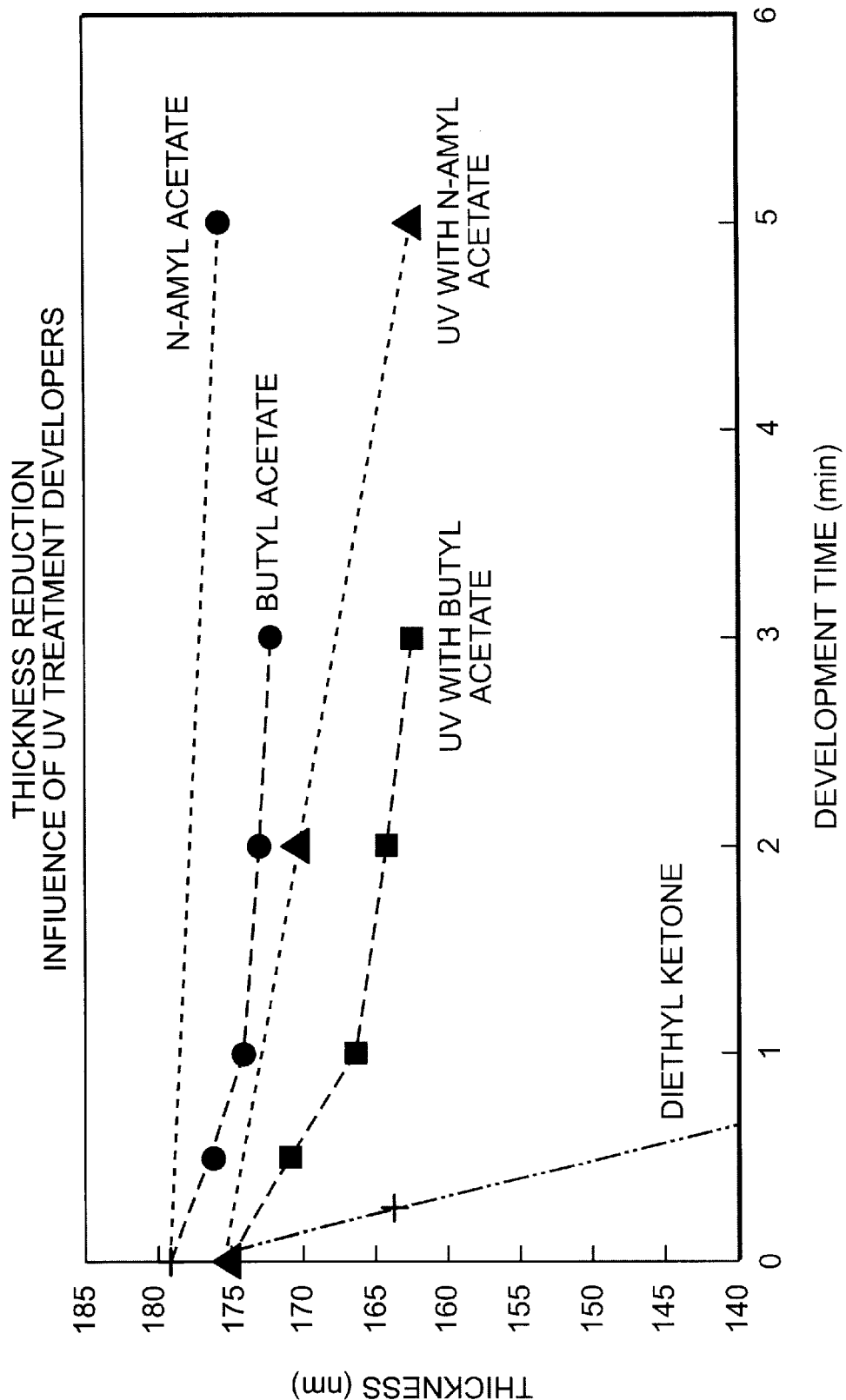
FIG. 3 is a graph showing thickness reduction as a function of time observed with various developers with or without UV irradiation after electron beam exposure.

Further, the effects of UV irradiation on thickness reduction of the resist during the development of a pattern was evaluated. The thickness reduction, which typically occurs during resist development, varies in accordance with the specific chemical composition of the developer. Three developers were evaluated: N-amyl acetate, butyl acetate and diethyl ketone. The first developer, N-amyl acetate, is typically used for high resolution, while the diethyl ketone is preferred for high sensitivity applications. FIG. 3 displays the thickness reduction as a function of time observed with various developers with or without UV irradiation after electron beam exposure. Here, the development temperatures were 27° C., 24° C., and 20° C. for N-amyl acetate, butyl acetate, and diethyl ketone, respectively. Diethyl ketone induces drastic thickness reduction even if the development time is short, which is not compatible with the patterning of nanometer patterns. With N-amyl acetate and butyl acetate, reasonable thickness reduction is observed. Obviously, the thickness reduction is somewhat increased as a result of UV exposure, but thickness reduction remains acceptable when the development has a duration of 3 minutes or less (preferably 2 minutes or less).

In accordance with a one embodiment of the present invention, a resist is first exposed to an electron beam for fine patterning and, as soon as possible thereafter, exposed to UV light. In an alternative embodiment, a resist is exposed to UV light before electron beam patterning. The second embodiment is usually less preferable because a surface roughness appears after the UV exposure which could negatively affect the resultant mask. In yet a third embodiment, a resist is simultaneously exposed to UV light and an electron beam for fine patterning.

Figure 4:
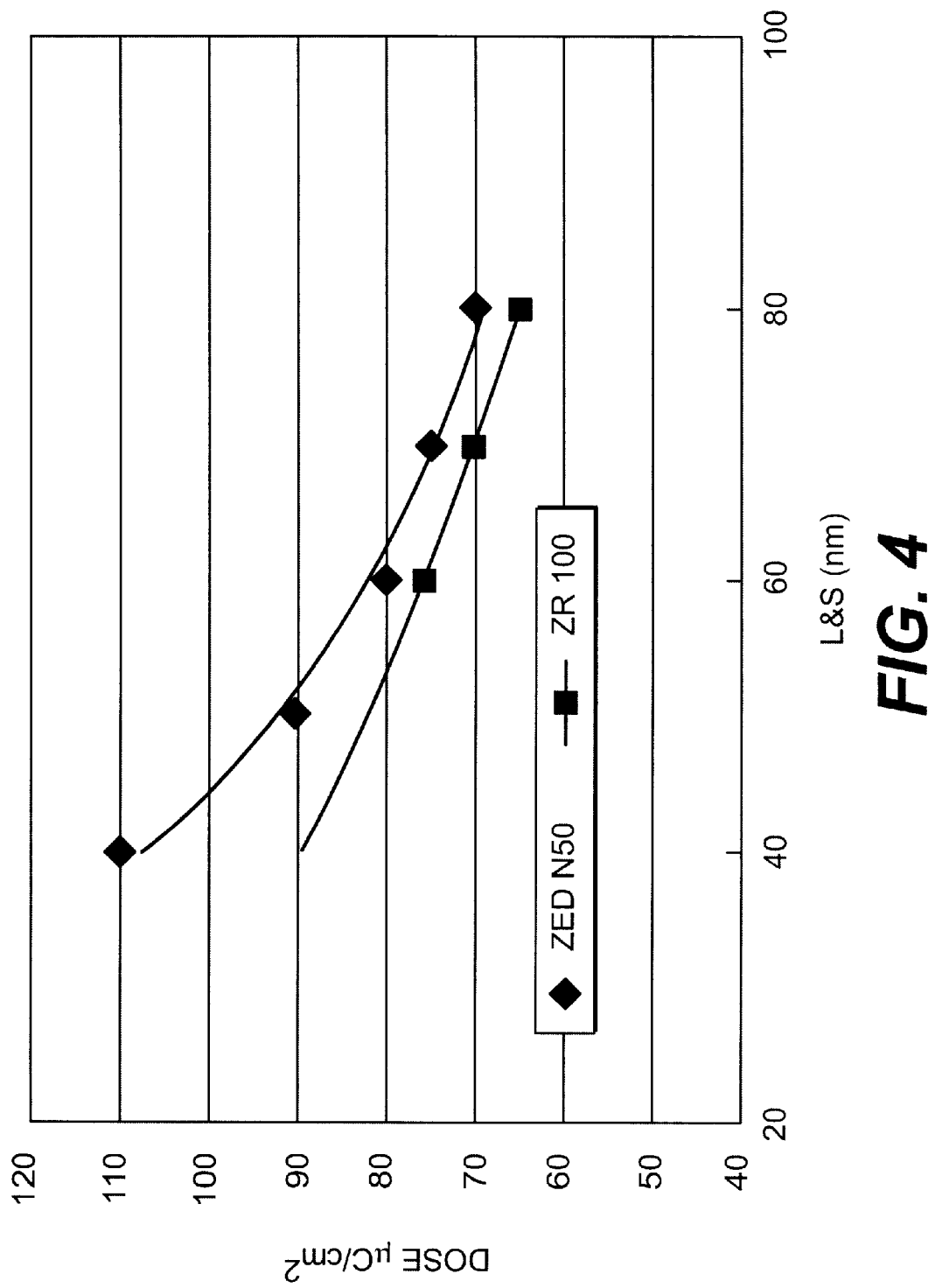
FIG. 4 is a graph showing the clearing dose observed for direct writing at a variety of conditions.

As discussed above, the techniques of the present invention improve the sensitivity of the resist for writing nanometer patterns. It is known that the direct writing of sub-100 nm patterns requires higher doses than that of sub-micron patterns. FIG. 4 shows the minimum dose for the patterning of 40–80 nm L&S with two developers: N-amyl acetate (ZED N50) at 27° C. for 5 minutes; and butyl acetate (ZR 100) at 24° C. for 1 minute. Here, clearing doses for direct writing of 60, 70, and 80 nm lines with respective pitches of 120, 140, 160 nm have been used. The critical dose for 40 nm L&S is at least twice the standard resist sensitivity (55 μC/cm$^2$ with N-amyl acetate), which is the dose at which all of the resist is removed for a given developing process. Based on an understanding of FIG. 4, a clearing dose from 110 to 300 μC/cm$^2$ may be necessary for the direct writing of 40–80 nm holes in thick resist (>150 nm).

Figure 5A:
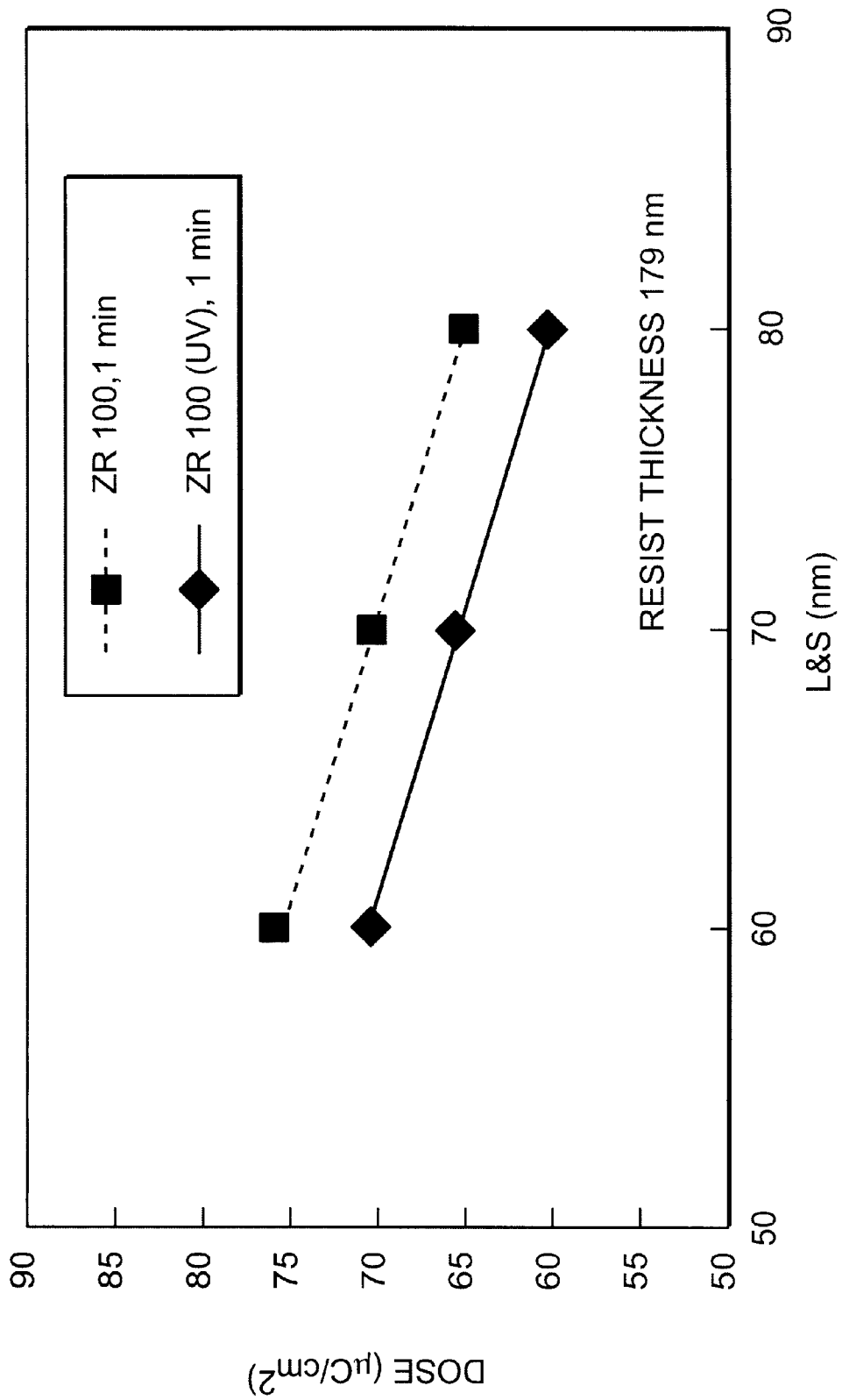
FIGS. 5A–5B and 6A–6B are graphs showing the clearing dose observed for direct writing at a variety of conditions.
Figure 5B:
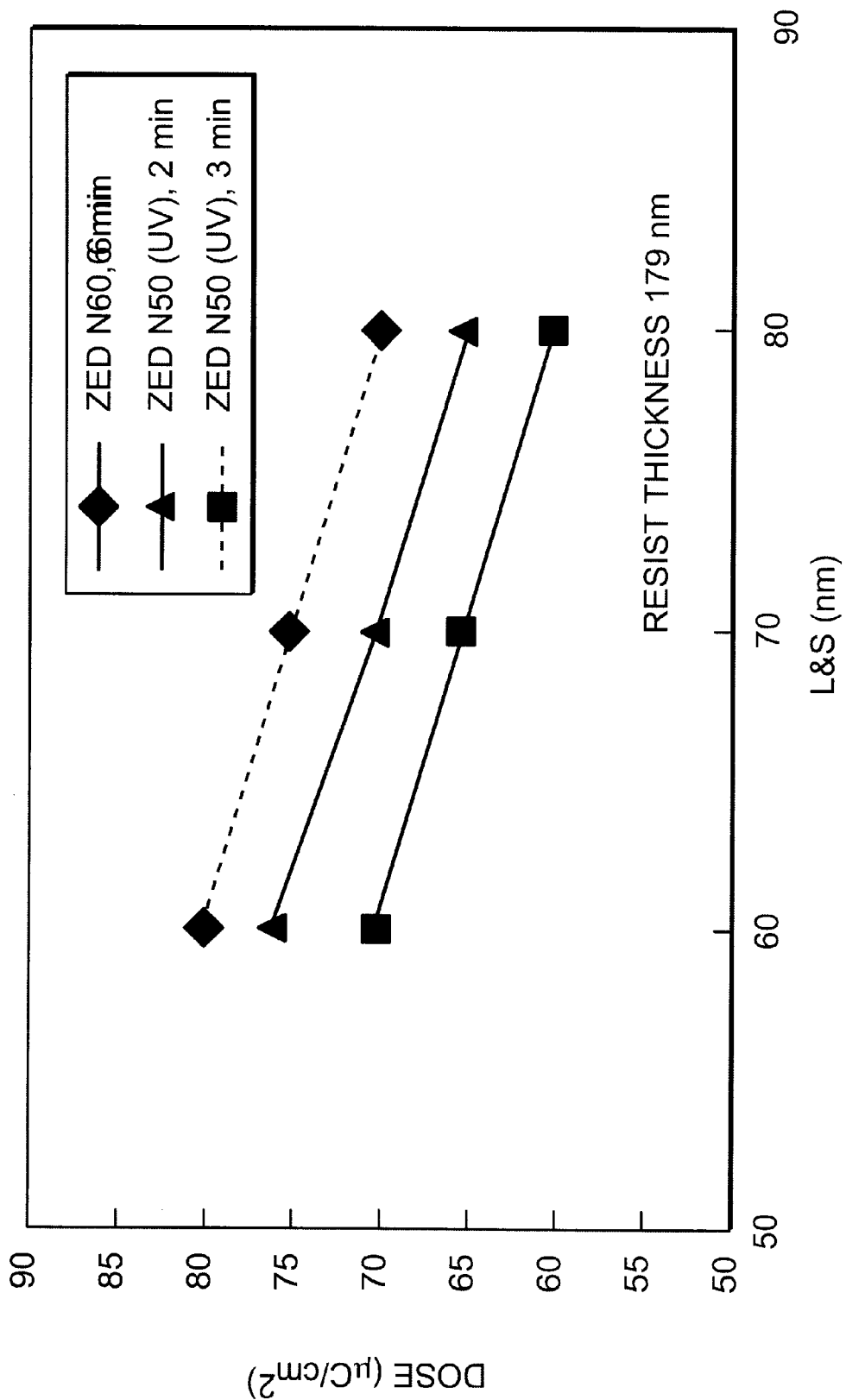
Figure 6A:
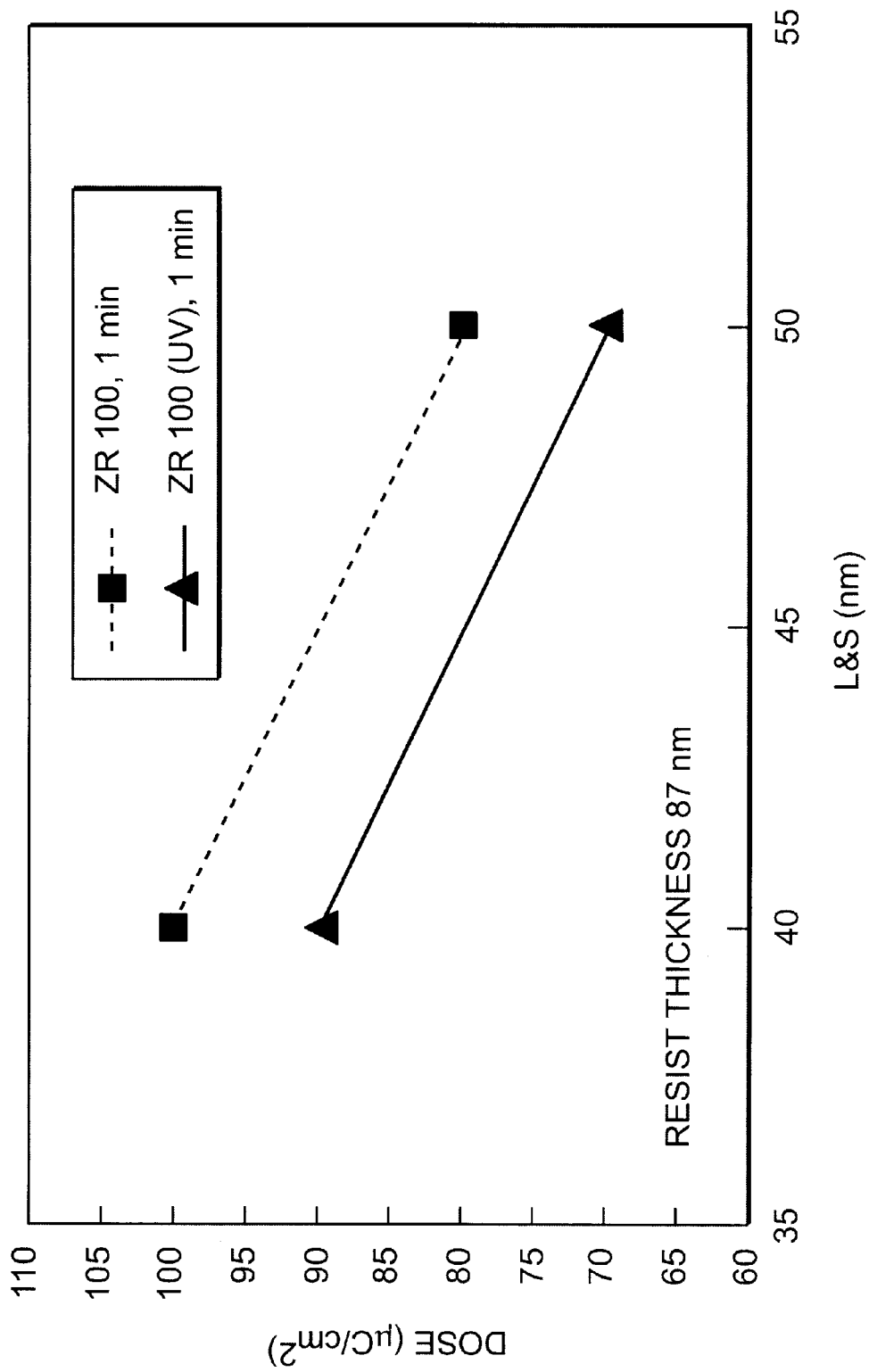
Figure 6B:
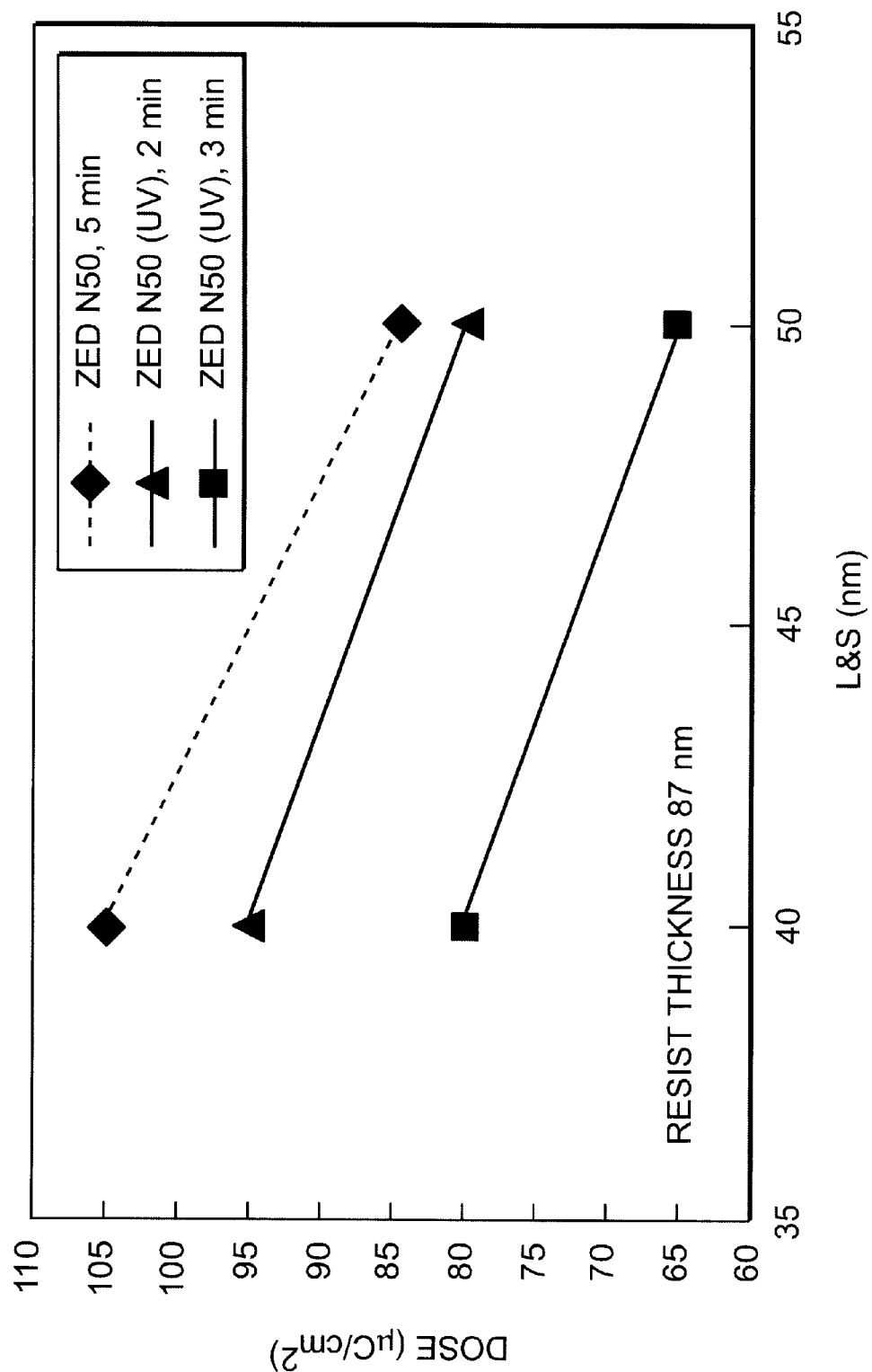

FIGS. 5A and 5B show the dose needed for patterning 60–80 nm L&S in 179 nm thick resist while using UV irradiation just after electron beam exposure. Similarly, FIGS. 6A and 6B show the dose needed for patterning 40–50 nm L&S in 87 nm thick resist. Here, development with N-amyl acetate (ZED N50) was conducted at 27° C. and development with butyl acetate is conducted at 24° C. With both developers (i.e., N-amyl acetate and butyl acetate), a sensitivity gain of about 15–20% is achieve as a result of the UV treatment. In addition, the development time with N-amyl acetate could be reduced to 2 minutes while still significantly enhancing the sensitivity. Here, longer development times may slightly improve the resist sensitivity to the detriment of the resolution, as will now be discussed.

Figure 7A:
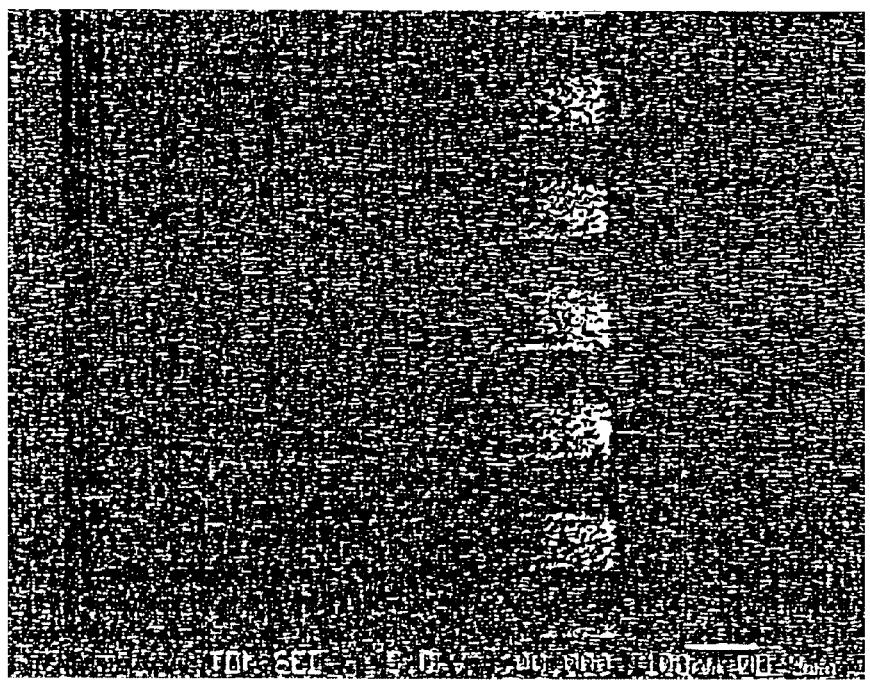
FIGS. 7A and 7B are comparative images of resist pattern shapes obtained using electron beam exposure without UV exposure and developed using N-amyl acetate for 5 minutes at 27 degrees C., and using butyl acetate for 1 minute at 24 degrees C., respectively.

To evaluate resolution, tests were conducted to compare pattern shapes obtained by electron beam exposure of 75 $\mu C/cm^2$ with and without UV irradiation. Without UV irradiation, the optimal development of nanometer patterns using N-amyl acetate requires at least 4 minutes together with a temperature higher than the room temperature (such as 27° C. for 5 minutes in FIG. 7A). In these conditions, the pattern width (as shown in FIG. 7A) for 80–60 nm L&S is narrower in the bottom than on the top. This is a result of backscattering of the ion beam off of the substrate. Moreover, it indicates a degradation in aspect ratio. Since the shape evolution is related to the development time as well, the back-scattering effect becomes more visible if a high resolution developer (such as N-amyl acetate) is used. Reducing the development time means that higher doses are needed to control the back-scattering effect. Thus, reduced development time prevents the use of short exposure time.

Figure 7B:
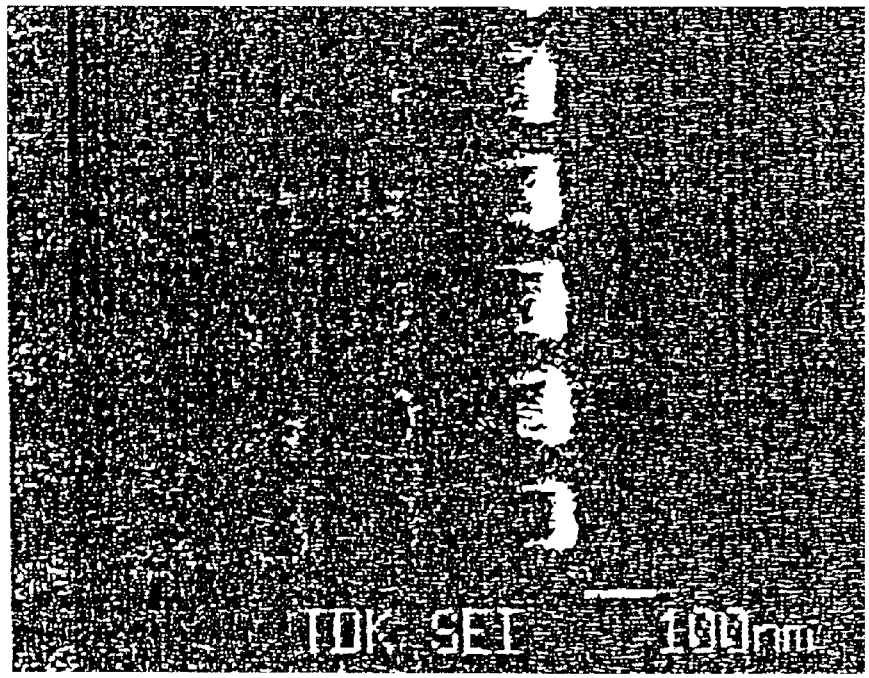

A better compromise between resolution and sensitivity is obtained with butyl acetate. With butyl acetate, the development time is only 1 minute and temperature is near room temperature (24° C.). Here, rectangular shapes can be successfully drawn as shown in FIG. 7B. Moreover, longer developments induced broader lines, yet no noteworthy shrinkage at the pattern bottom was ever observed.

Figure 8A:
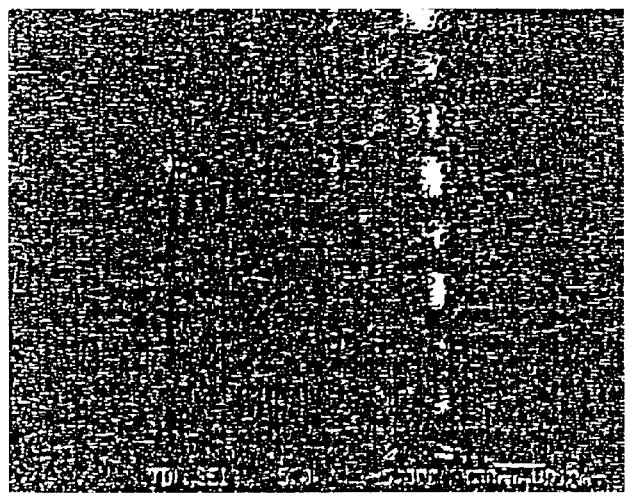
FIGS. 8A, 8B and 8B are comparative images of resist pattern shapes obtained using electron beam exposure with UV exposure and developed using N-amyl acetate at 27 degrees C. for 2 minutes, 3 minutes, and 5 minutes, respectively.
Figure 8B:
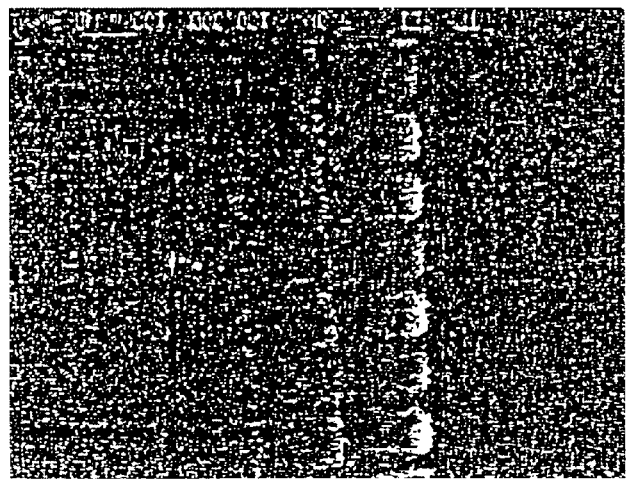
Figure 8C:
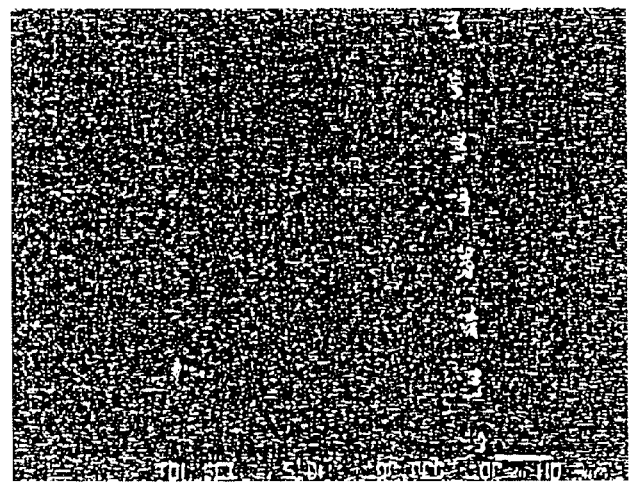

FIGS. 8A–8C show the evolution of the pattern shape for various development times with UV exposure using N-amyl acetate at 27° C. as a developer. With reference to FIG. 8A, well developed rectangular patterns are obtained for an electron beam dose of 85 $\mu C/cm^2$ and a development time of 2 minutes as shown in FIG. 8A. However, with reference to FIG. 8B, after a 75 $\mu C/cm^2$ dose and 3 minutes of development, the shape has a lower aspect ratio and is similar to the pattern of FIG. 7A, which was obtained without UV irradiation and with a development time of 5 minutes. As shown in FIG. 8C, with a longer development time of 5 minutes, a 60 nm L&S pattern tends to collapse due to the width reduction at the lower part of the resist. In some embodiments of the present invention, such as ones involving lift-off processes, a pattern with such a low aspect ratio is desired because it is more easily removed from its substrate.

Figure 9A:
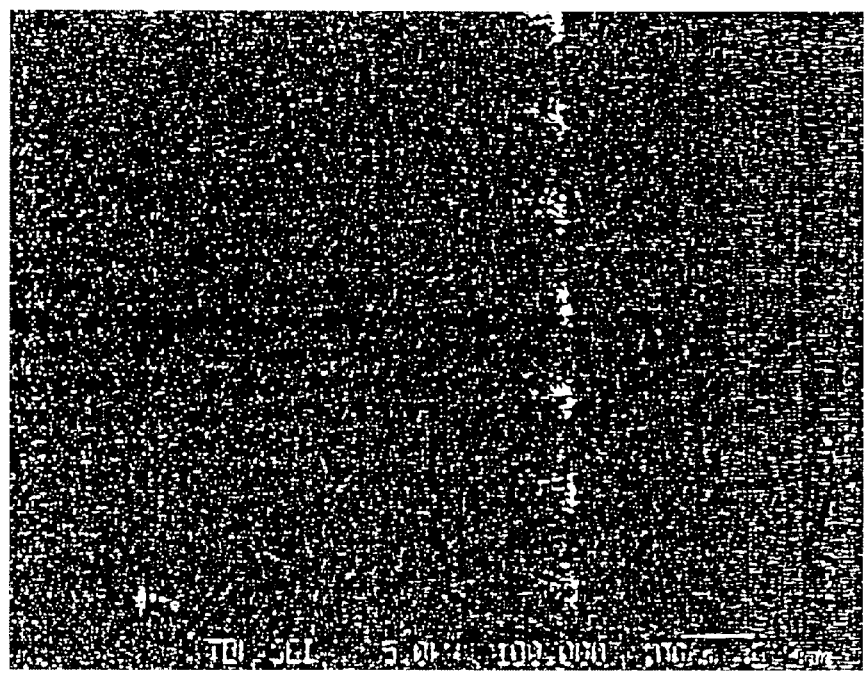
FIGS. 9A–9B show comparative images of resist pattern shapes obtained with UV exposure and without UV exposure, respectively, using butyl acetate as the developer.
Figure 9B:
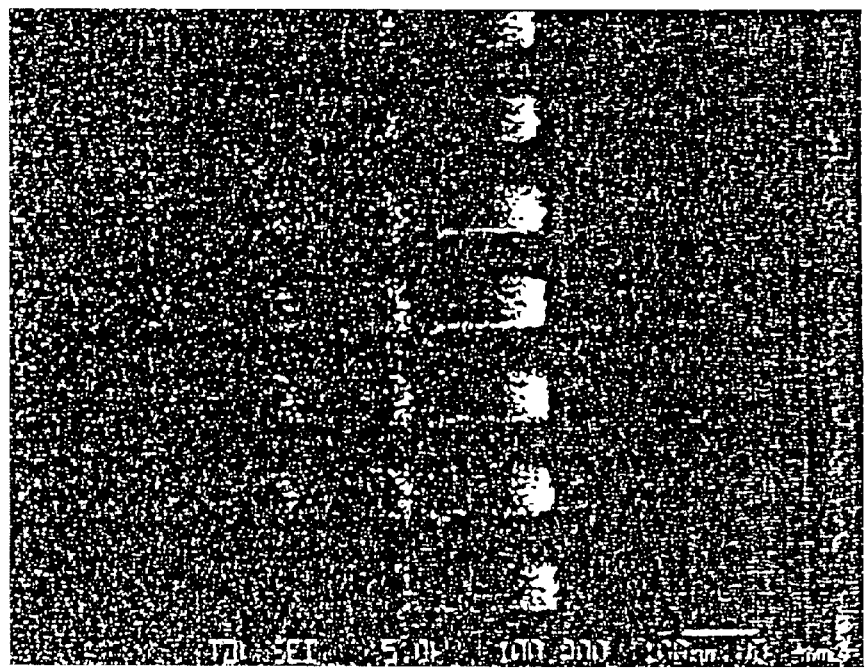

Using butyl acetate at 24° C. for 1 minute as a developer, the resist sensitivity is increased with UV exposure as compared to that without UV exposure without degradation in pattern shape as shown in FIGS. 9A and 9B. Here, FIG. 9A reflects a dose of 75 $\mu C/cm^2$ without UV exposure whereas FIG. 9B reflects a dose of 65 $\mu C/cm^2$ with UV exposure.

Figure 10:
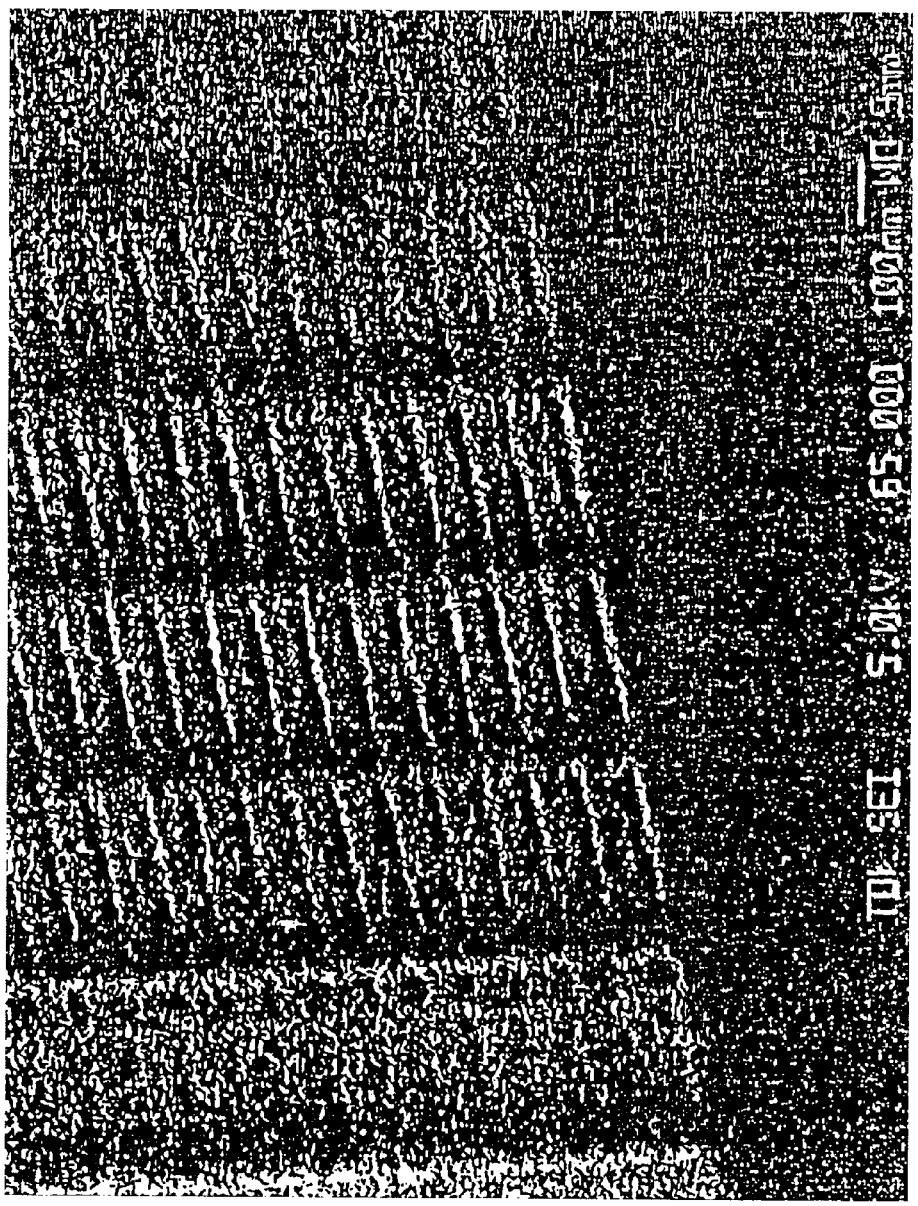
FIG. 10 shows a pattern having 40 nm L&S resolution obtained in accordance with the present invention.

As explained above, in accordance with the present invention, the combination of UV exposure and electron beam exposure results in a remarkable increase in the resist sensitivity. One of the major benefits with a high-resolution developer such as N-amyl acetate is the development time reduction from 5 minutes to 2 minutes. In these conditions, the resist sensitivity emulates the one obtained with a high sensitivity developer such as butyl acetate, thus the patterns are quite similar and show straight edges. Here, it is believed that the UV exposure induces oxidation in addition to polymeric chain scission. Thus, chemical modification leads to solubility parameter changes, thereby slightly reducing the solubility difference between the two developers. In addition, the thickness reduction due to the development conditions remains acceptable using N-amyl acetate because the development times can be reduced to 2 minutes. Longer development times result in undesired shrinkage at the pattern bottom as well as resist thickness reduction. Since the conventional use of butyl acetate causes the thickness reduction with development times as short as 1 minute, it would be better to use a high resolution developer (such as N-amyl acetate at 27° C. for 2 minutes) with the hybrid exposure process of the present invention, thereby obtaining a good compromise between resolution and sensitivity. As shown in FIG. 10, resolution up to 40 nm L&S in 87 nm-thick resist can be achieved.

Thus, the hybrid exposure of ZEP chain scission type resist in accordance with the present invention achieves superior pattern forming performance. Here, UV exposed resist provides high sensitivity to achieve high resolution patterns while using a high resolution developer. Accordingly, the coupling of deep UV lithography and electron beam lithography can be successfully applied to achieve the direct writing of small patterns. While the examples presented above related to chain scission type resists, other resists, such as chemical amplified resists, may also benefit from such techniques.

While the present invention finds particular application in the production of resist layers for manufacturing electronics components such as chips or integrated circuits, thin-film read/write heads for magnetic storage media, and pattern media for magnetic storage, one should readily appreciate that the present invention will find application in the production of other devices and in other environments.

It will be apparent to those skilled in the art that various modifications and variations can be made in the method and apparatus for forming fine exposure patterns of the present invention without departing from the spirit or scope of the invention. Thus, it is intended that the present invention cover the modifications and variations of this invention provided they come within the scope of the appended claims and their equivalents.

What is claimed is:

1. A method for forming a pattern in a resist, comprising the steps of:

forming a resist on a surface of a substrate;

exposing a first portion of the resist to a charged particle beam to alter a first characteristic of the first portion of the resist;

exposing a second portion of the resist to electromagnetic radiation to alter a second characteristic of the second portion of the resist, the second portion being larger than the first portion and including the entire first portion; and removing at least part of the first portion of the resist in which the first and second characteristics are altered such that a remaining portion defines the pattern in the resist.

2. The method according to claim 1, wherein the step of exposing a first portion of the resist includes a step of exposing the resist to an electron beam.

3. The method according to claim 1, wherein the step of forming a resist includes the step of forming a layer of resist having a thickness of 0.05 to 0.3 $\mu$m.

4. The method according to claim 1, wherein the step of exposing a first portion of the resist to an electron beam is performed before the step of exposing the resist to electromagnetic radiation.

5. The method according to claim 1, wherein the step of exposing the resist to electromagnetic radiation includes a step of exposing the resist to ultraviolet (UV) radiation.

6. The method according to claim 1, wherein the step of exposing the resist to electromagnetic radiation includes a step of exposing the resist to UV radiation having a wavelength of 200–230 nm.

7. The method according to claim 1, wherein the step of exposing the resist to electromagnetic radiation includes exposing the resist to an exposure dose of 30 to 120 $\mu$C/cm$^2$.

8. The method according to claim 1, wherein the step of exposing the resist to electromagnetic radiation includes a step of exposing the resist to UV radiation having an intensity less than 100 mJ/cm$^2$.

9. The method according to claim 1, wherein the step of exposing the resist to UV radiation includes a step of exposing the resist to UV radiation having an intensity between 85–90 mJ/cm$^2$.

10. The method according to claim 1, wherein the step of removing includes a step of developing using one of N-amyl acetate and butyl acetate.

11. The method according to claim 1, wherein the pattern defined in the resist has a resolution less than 100 nm.

12. The method according to claim 1, wherein the pattern defined in the resist has a resolution of 40 nm or less.

13. A method for forming a pattern in a resist, comprising the steps of:

forming a resist on a surface of the substrate;

exposing a representation of a pattern on a first portion of the resist to an electron beam to alter a first characteristic of the first portion of the resist, the representation of the pattern on the resist having a resolution less than 100 nm;

exposing a second portion of the resist to electromagnetic radiation having a wavelength greater than or equal to 200 nm and an intensity less than 100 mJ/cm$^2$ in order to alter a second characteristic of the second portion of the resist, the second portion being larger than the first portion and including the entire first portion; and removing at least part of the first portion of the resist in which the first and second characteristics are altered such that a remaining portion defines the pattern in the resist.

14. A method for manufacturing an article, comprising the steps of:

forming a resist on a surface of a substrate;

exposing a representation of a pattern on a first portion of the resist to an electron beam to alter a characteristic of the first portion of the resist, the representation of the pattern having a resolution of less than 100 nm;

exposing a second portion of the resist to electromagnetic radiation to alter a characteristic of the second portion of the resist, the second portion being larger than the first portion and including the entire first portion;

developing the resist to substantially remove the first portion of the resist in which the first and second characteristics are altered such that a remaining portion defines the pattern; and using the resist to manufacture the article.

15. The method according to claim 14, wherein the article is one of an integrated circuit, a thin-film read/write head for magnetic storage media, and pattern media.

* * * * *